(12) United States Patent
Hwang et al.

(10) Patent No.: US 8,546,802 B2
(45) Date of Patent: Oct. 1, 2013

(54) PICK-AND-PLACE TOOL FOR PACKAGING PROCESS

(75) Inventors: Chien Ling Hwang, Hsin-Chu (TW); Ying-Jui Huang, Taipei (TW); Yi-Li Hsiao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/290,855

(22) Filed: Nov. 7, 2011

(65) Prior Publication Data
US 2013/0115752 A1 May 9, 2013

(51) Int. Cl.
*H01L 23/58* (2006.01)
*H01L 21/66* (2006.01)

(52) U.S. Cl.
USPC .................................. 257/48; 438/18

(58) Field of Classification Search
USPC .................. 438/FOR. 101, 102, 142, 14–18; 257/48, E21.521–E21.53
See application file for complete search history.

(56) References Cited

U.S. PATENT DOCUMENTS

| | | | |
|---|---|---|---|
| 6,238,515 B1* | 5/2001 | Tsujimoto et al. | 156/379.8 |
| 6,313,653 B1* | 11/2001 | Takahashi et al. | 324/750.06 |
| 2003/0088959 A1* | 5/2003 | Tsujimoto | 29/25.01 |

* cited by examiner

*Primary Examiner* — Calvin Lee
(74) *Attorney, Agent, or Firm* — Slater & Matsil, L.L.P.

(57) ABSTRACT

An apparatus includes a guide ring, and a bond head installed on the guide ring. The bond head is configured to move in loops along the guide ring. The bond head is configured to pick up dies and place the dies during the loops.

20 Claims, 7 Drawing Sheets

PICK-AND-PLACE TOOL FOR PACKAGING PROCESS

BACKGROUND

The manufacturing of integrated circuits often involves the bonding of device dies to package substrates. In a typical bonding process, a device die is first picked up from a wafer that has already been sawed into dies. The device die is flipped upside down and placed on a table. A bond head then picks up the flipped device die from the table, and then places the device die on a package substrate. After a plurality of devices dies are placed on a plurality of package substrate of a package substrate strip, the package substrate strip along with the device dies go through a reflow process, so that the device dies are bonded to the package substrates.

The Accuracy in the placement of the device die on the package substrate needs to be well controlled to maintain the yield of the bonding process. On the other hand, the throughput of the pick-and-place process also needs to be improved. However, the requirement in the accuracy of the placement conflicts with the requirement of the increasing the throughput. For example, to improve the throughput, the moving speed of the bond head needs to be increased. However, the increased moving speed results in the sacrifice in the accuracy of the placement. Although multiple bond heads may be used for picking and placing the device dies, each of the multiple bond heads needs to wait for the work space used by other bond heads to be cleared before it can be put into work. The improvement in the throughput is thus limited.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A pick-and-place tool for packaging integrated circuits and the method of using the tool are provided in accordance with various embodiments. The variations and the operation of the embodiments are discussed. Throughout the various views and illustrative embodiments, like reference numbers are used to designate like elements.

Figure 1:
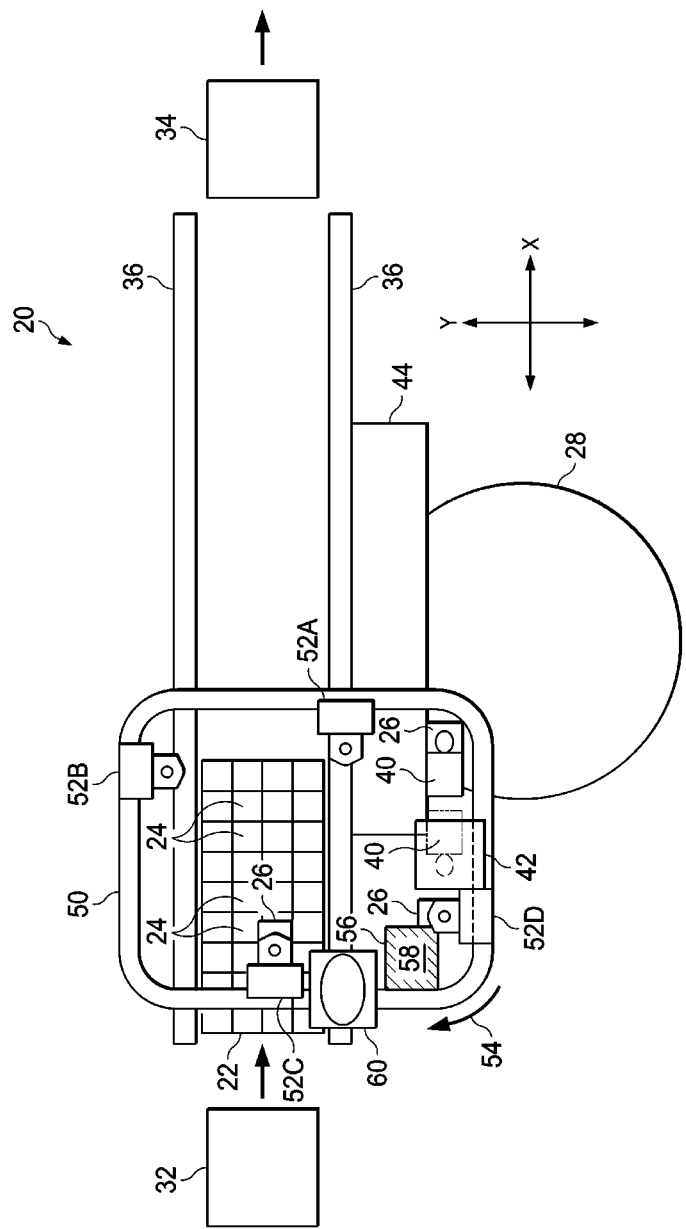
FIGS. 1 through 3 are top views of intermediate stages in the pick-and-place process of dies in accordance with various embodiments, wherein a plurality of bond heads are installed on a guide ring.

FIG. 1 illustrates a top view of pick-and-place tool 20 in accordance with embodiments. Pick-and-place tool 20 is used for placing dies 26 in wafer 28 (please also refer to FIG. 7) onto package components 24, which are collectively in package component strip (or wafer) 22. In some embodiments, package components 24 are package substrates, and hence are referred to as package substrates 24 hereinafter, although they may be another type of package components such as interposers. Package component strip/wafer 22 may be a package substrate strip. Accordingly, package component strip/wafer 22 is alternatively referred to as package substrate strip 22 throughout the description, although package component strip/wafer 22 may also be of other forms such as an interposer wafer. Package component strip/wafer 22 may have a rectangular top-view shape as illustrated in FIG. 1. Alternatively, package component strip/wafer 22 may have other top-view shapes such as a circular shape.

Loader 32 is disposed on a first end of load guides 36, and is configured to load package substrate strip 22 into pick-and-place tool 20, so that package substrate strip 22 may be transferred along load guides 36. After placed with dies 26 thereon, package substrate strips 22 may be unloaded from pick-and-place tool 20 by unloader 34, and sent for subsequent process steps such as reflow.

Figure 7:
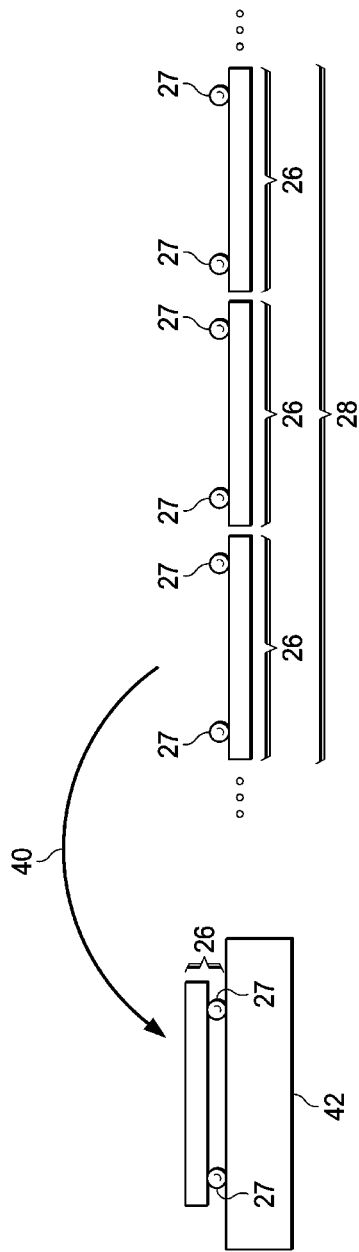
FIG. 7 illustrates a cross-sectional view in the picking of a die from a wafer, and the flipping of the die.

Wafer 28 may be a device wafer, and dies 26 in wafer 28 may be device dies including integrated circuit devices (such as transistors) therein. FIG. 7 illustrates a cross-sectional view of a portion of wafer 28. Dies 26 that are in wafer 28 may be placed with electrical connectors 27 facing up, wherein electrical connectors 27 are to be placed on, and bonded to, package substrates 24 in subsequent process steps (please refer to FIG. 8). Dies 26 have been sawed apart, and hence may be pickup up and placed individually.

Flipper 40 as in FIG. 1 is used to pick up dies 26 one-by-one and flip dies 26, so that connectors 27 (FIG. 7) of dies 26 may face down for the subsequent bonding process. The flipping step is schematically illustrated in FIG. 1. The flipper 40 shown in solid lines illustrates the position of flipper 40 for picking up die 26 from wafer 28, while the flipper 40 shown in dotted lines illustrates the position of the same flipper 40 for dropping flipped die 26 on table 42. FIG. 7 schematically illustrate the positions of die 26 before and after flipping, wherein the arrow represents the flipping step.

Flipper 40 may then place the flipped die 26 on table 42, as shown in FIGS. 1 and 7. As shown in FIG. 1, flipper 40 is installed on flipper guide 44, and may slide back and forth (in the illustrated X directions). Wafer 28 may be moved in the X and Y directions, so that each time, one of dies 26 in wafer 28 is moved to directly under flipper 40, and hence can be picked up and flipped by flipper 40.

Guide ring 50 is installed over load guides 36. A plurality of bond heads 52 (denoted as 52A through 52D) are installed on guide ring 50. Although four bond heads 52 are illustrated as an example, in alternative embodiments, there may be a single one, two, three, or more than four bond heads installed on guide ring 50. Guide ring 50 forms a full ring, so that when bond heads 52 are moved in one direction (such as the direction of arrow 54), bond heads 52 may move continuously along guide ring 50 in a plurality of loops. Bond heads 52A through 52D may move independently, and the actions (such as stopping, moving, accelerating, and decelerating) of each of bond heads 52A through 52D may be controlled independently from the actions of other bond heads 52. Bond heads 52A through 52D generally move in the same forward direction as shown by the direction of arrow 54, and are configured not to have substantial backward movement in the direction opposite to the direction of arrow 54. However, optionally, bond heads 52A through 52D may have slight backward movement for the adjustment of positions such as when bond heads 52A through 52D are aligned to table 42, flux tank 56, and alignment tool 60. The actions of bond heads 52A through 52D may be controlled and synchronized by a same control unit (not shown), which may be electrically connected to bond heads 52A through 52D, and configured to control the actions of alignment tool 60, the movement of wafer 28, and the movement of package substrate strip 22.

Figure 2:
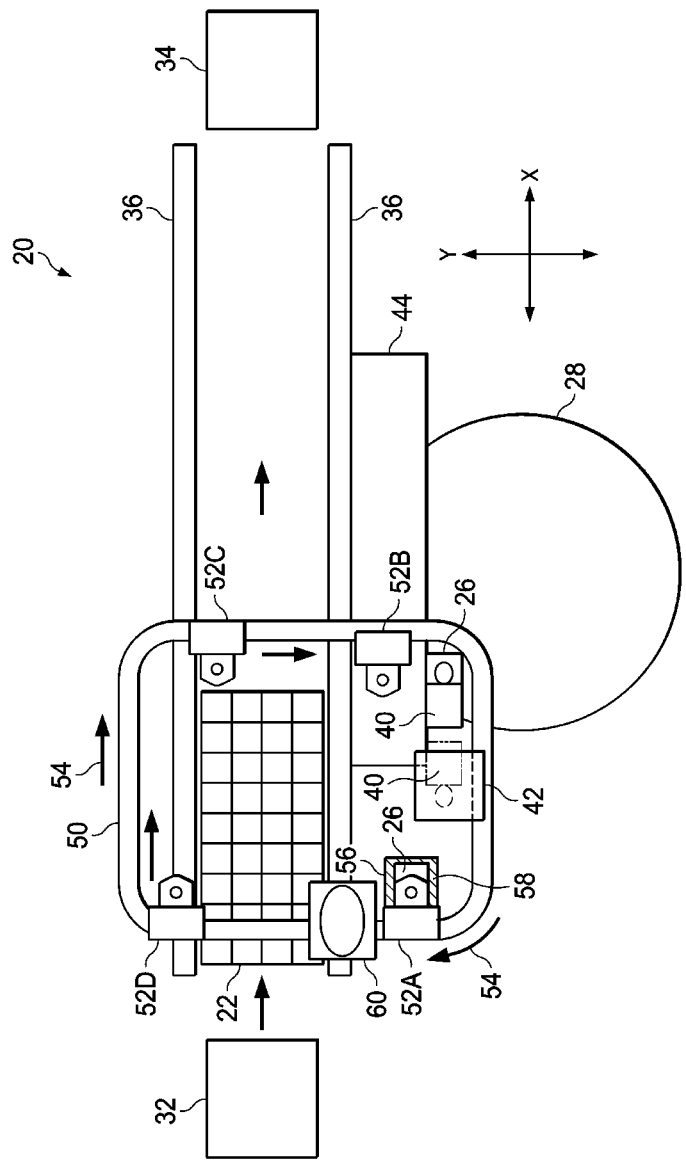
Figure 3:
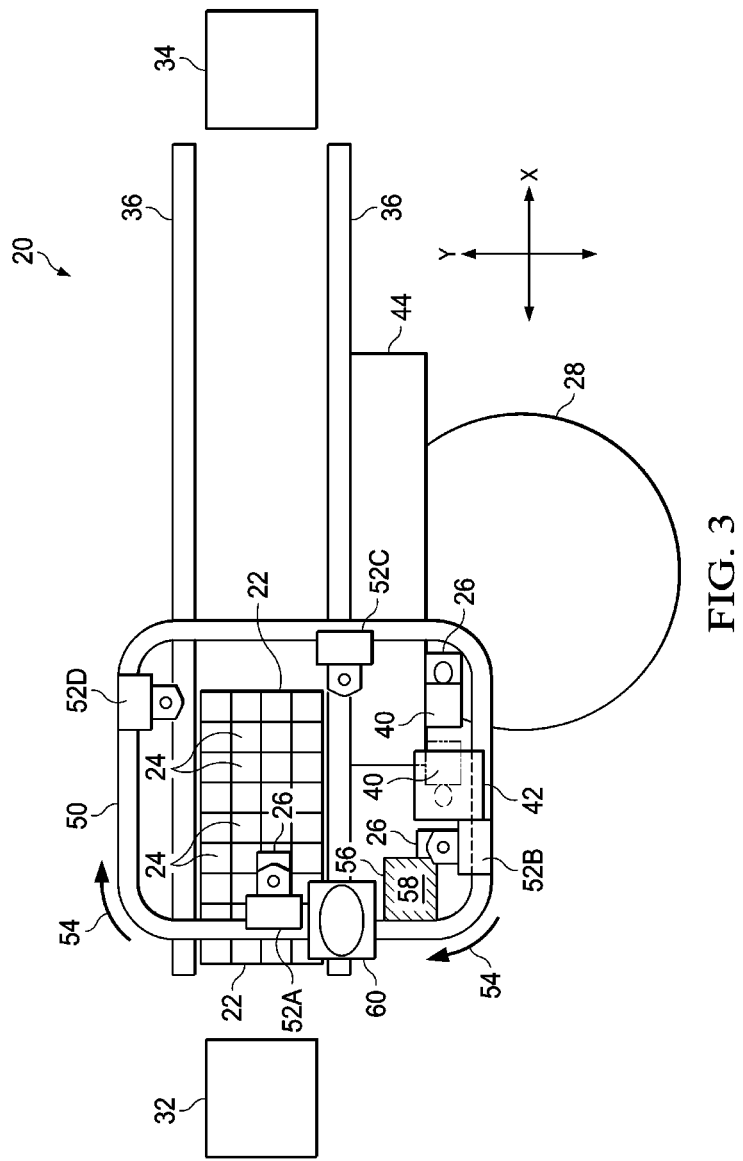

An exemplary pick-and-place process is shown in FIGS. 1 through 3, and is briefly described as follows. First, as shown in FIG. 1, flipper 40 picks up one of dies 26 from wafer 28, glide to the position of table 42, and drops the flipped die 26 onto table 42. Next, as shown in FIG. 2, bond head 52A moves forward along guide ring 50 to the position of table 42, and picks up die 26. Bond head 52A may be a vacuum head that picks up die 26 through vacuuming. Bond head 52 then moves forward to flux tank 56, which contains flux 58 therein (please also refer to FIG. 1). Bond head 52A then dips the front side of die 26 in flux 58, so that connectors 27 (not shown in FIG. 2, please refer to FIG. 7) are dipped with flux 58.

Figure 8:
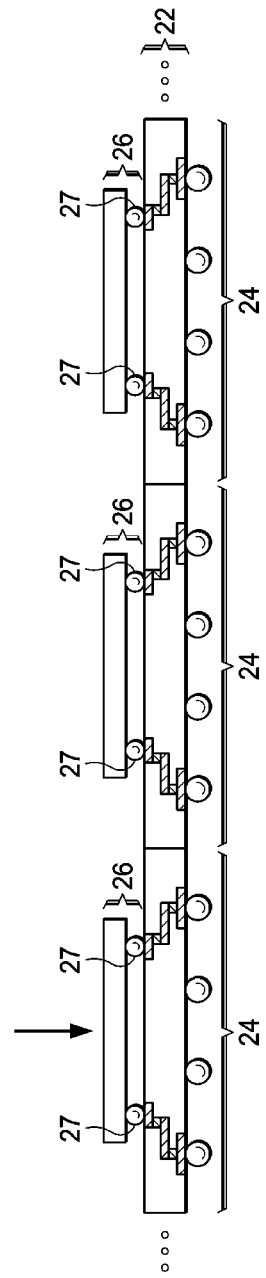
FIG. 8 illustrates a plurality of dies placed on a plurality of package substrates of a package substrate strip.

Bond head 52A then moves to alignment tool 60, which is configured to scan die 26 and help determine the X and Y coordinates and the angle of die 26. In the case that die 26 is not aligned accurately to X and Y directions, bond head 52A may also rotate die 26 slightly in the plane parallel to the X and Y directions until die 26 is accurately aligned to the X and Y directions. Bond head 52A then moves forward to over package substrate strip 22, and place die 26 on a desirable one of package substrates 24. At the time package substrate strip 22 is loaded, the positions of package substrates 24 have been scanned, and the exact position of each of package substrates 24 is known. Accordingly, package substrate strip 22 may be moved in the X and Y directions, so that die 26 is aligned to and accurately placed on the respective package substrate 24. FIG. 8 illustrates a cross-sectional view of dies 26 placed on package substrates 24.

Next, as shown in FIG. 3, after the placement of die 26, bond head 52A continues the movement in the direction of arrow 54. At the same time that bond head 52 performs the actions of picking up die 26, dipping die 26 in flux 58, aligning die 26, and placing die 26 on one of package substrates 24, flipper 40 picks up and flips other dies 26 and places dies 26 on table 42 one-by-one. In the meantime, bond heads 52B, 52C, and 52D also move forward, and perform essentially the same actions as bond head 52A as shown in FIGS. 1 through 3. Bond heads 52A through 52D loop on guide ring 50, and in each loop, each of bond heads 52A through 52D picks and places one die 26, until all package substrates 24 in package substrate strip 22 has one of dies 26 placed thereon. Package substrate strip 22 is then transported to the right, and is unloaded from pick-and-place tool 20 by unloader 34.

It is observed that in the above-described process, bond heads 52 move in one direction, and do not need to move back and forth, this saves the back traveling time. Particularly, without the back traveling, bond heads 52 do not need to wait for each other for the clearance of the work space used by other bond heads 52. The efficiency in the pick-and-place of the dies is thus improved.

Figure 4:
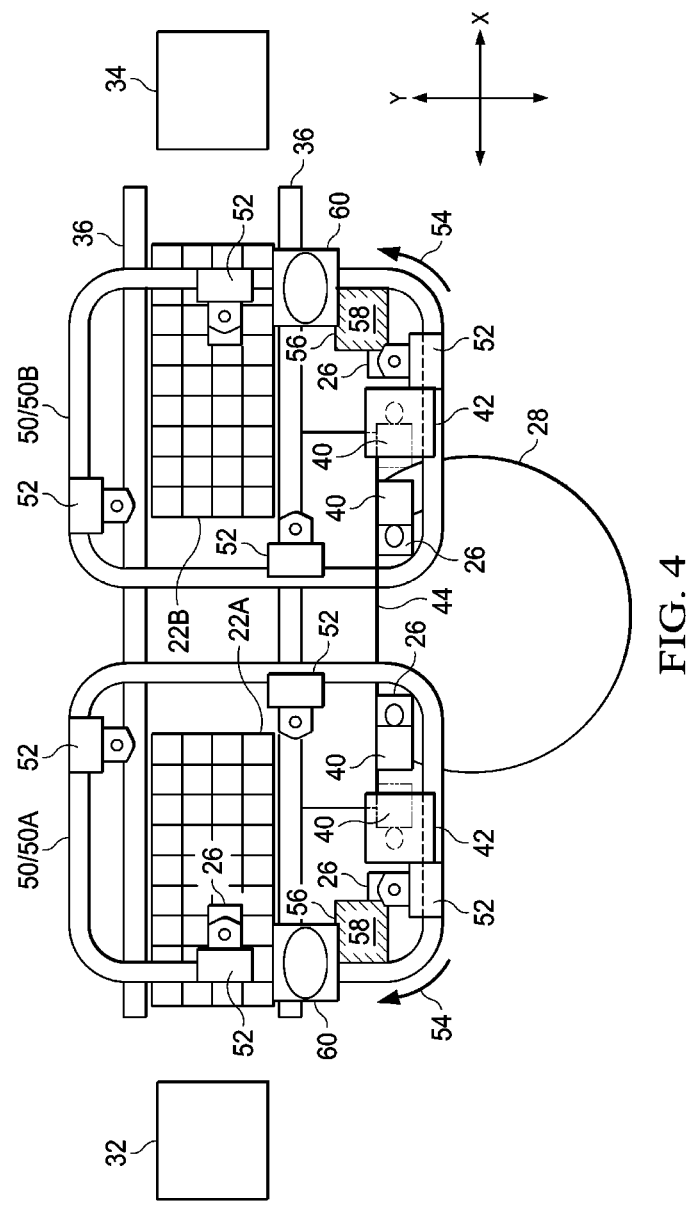
FIG. 4 illustrates a top view of an intermediate stage in the pick-and-place process of dies in accordance with alternative embodiments, wherein a plurality of bond heads are installed on each of two guide rings.

FIG. 4 illustrates pick-and-place tool 20 in accordance with alternative embodiments. These embodiments are similar to the embodiments shown in FIG. 3, except there are two guide rings 50 (including 50A and 50B) in pick-and-place tool 20. Each of guide rings 50 has one or a plurality of bond heads 52 installed thereon. Furthermore, there may be two flippers 40, each serving the bond heads 52 that are installed on one of guide rings 50. The bond heads 52 on each of guide rings 50 are responsible for placing dies 26 on one of package substrate strips 22A and 22B. Again, wafer 28 may be moved in X and Y directions, so that dies 26 may be moved to directly under the flippers 40 that are about to pick dies 26. Each of package substrate strips 22A and 22B may be movable in X and Y directions so that the respective package substrates 24 may be moved to directly under the respective bond heads 52 that are about to place dies 26. The operation of bond heads 52 on each of guide rings 50 is essentially the same as shown in FIGS. 1 through 3.

Figure 5:
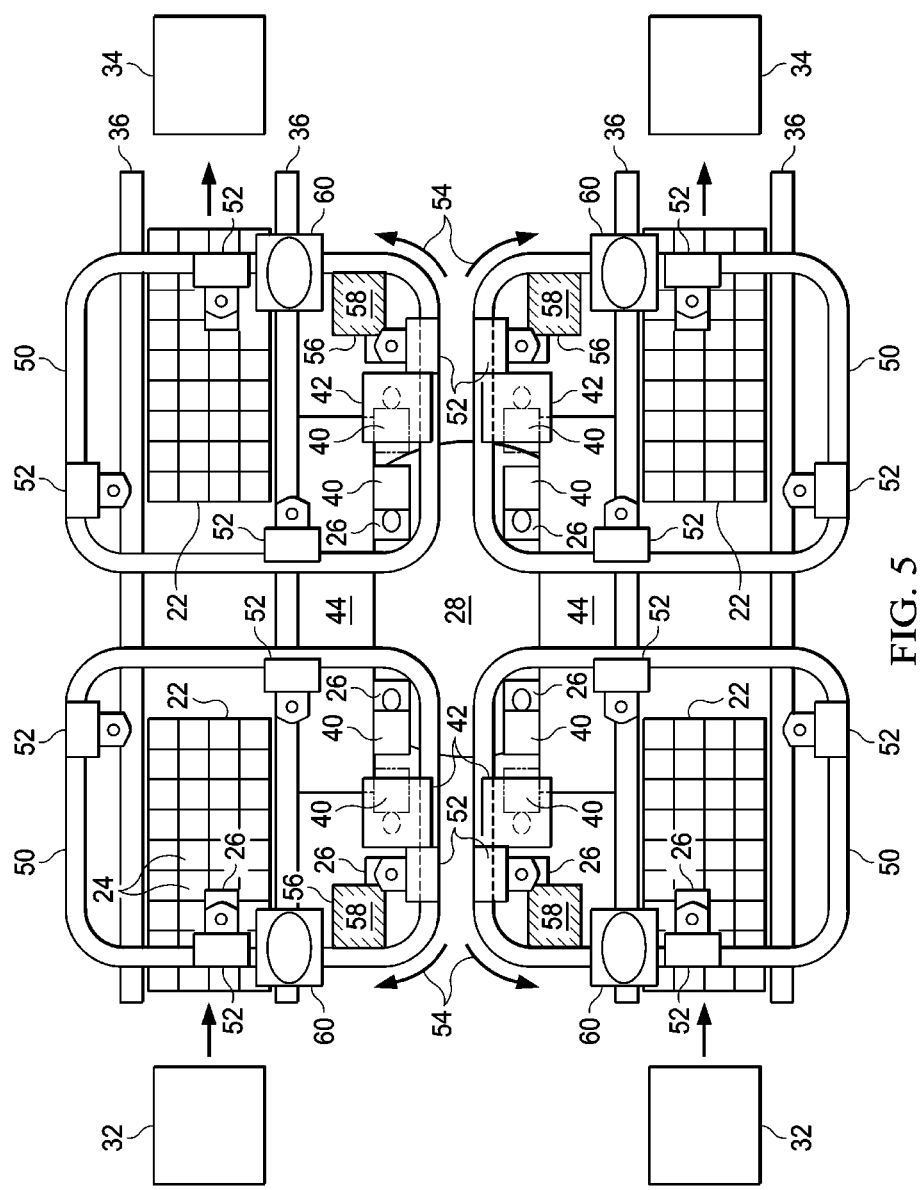
FIG. 5 illustrates a top view of an intermediate stage in the pick-and-place process of dies in accordance with alternative embodiments, wherein a plurality of bond heads are installed on each of four guide rings.

FIG. 5 illustrates pick-and-place tool 20 in accordance with alternative embodiments. These embodiments are similar to the embodiments in FIGS. 1 through 4, except there are four guide rings 50 (including 50A through 50D) in pick-and-place tool 20. Each of guide rings 50 has one or a plurality of bond heads 52 installed thereon. The operation of each of bond heads 52 on each of guide rings 50 may be essentially the same as shown in FIGS. 1 through 3, and hence are not repeated herein. In FIG. 5, two guide rings 50 may share a set of loader 32 and unloader 34 and a set of load guides 36. By using the embodiments in FIGS. 4 and 5, the interface tools such as loader 32, unloader 34, the tools for controlling the movement of wafer 28, and the like, may be shared between a plurality of guide rings 50, and the cost of tools and the work space for deploying the tools are saved.

Figure 6:
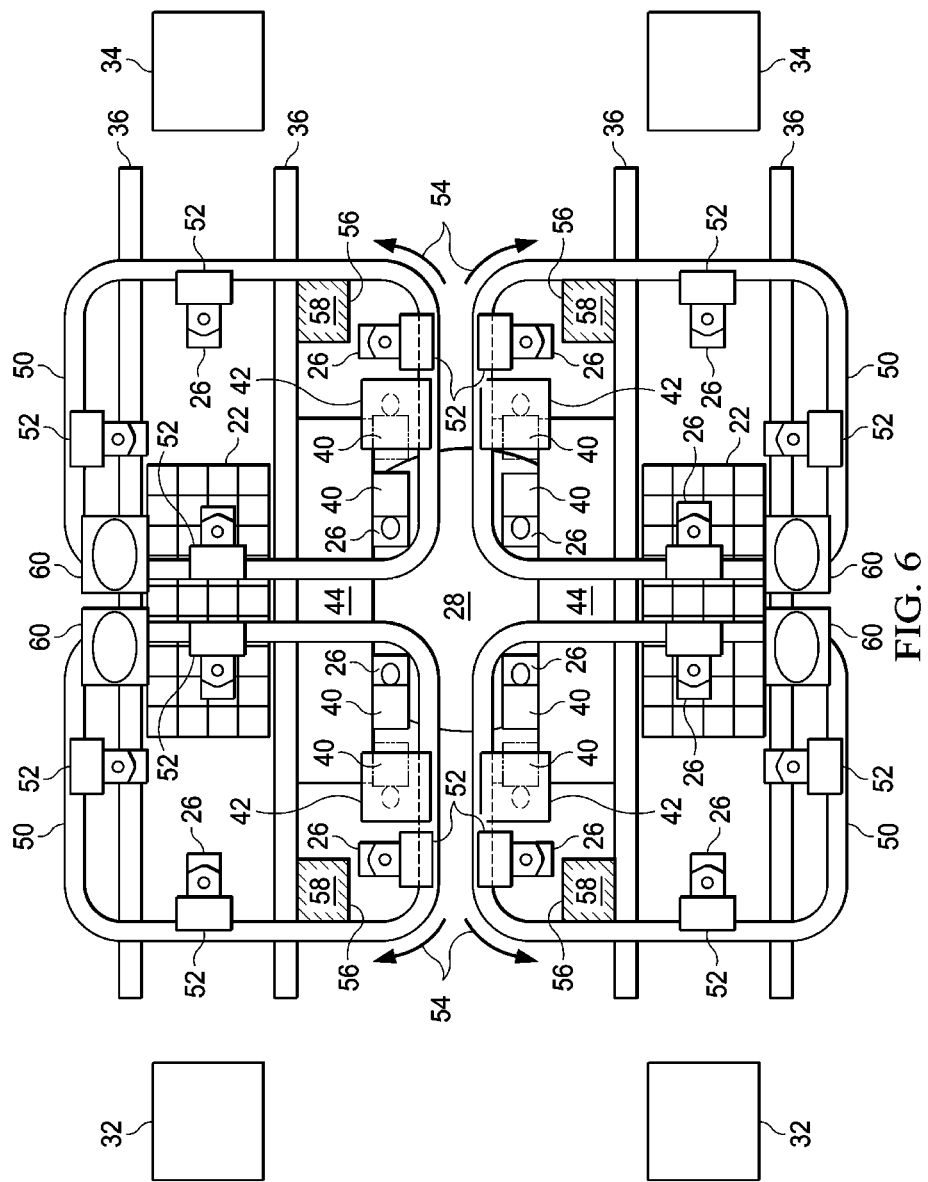
FIG. 6 illustrates a top view of an intermediate stage in the pick-and-place process of dies in accordance with alternative embodiments, wherein bond heads on two neighboring guide rings are used to bond dies onto a same package substrate strip.

FIG. 6 illustrates pick-and-place tool 20 in accordance with yet alternative embodiments. These embodiments are similar to the embodiments in FIG. 5, except bond heads 52 on two neighboring guide rings 50 are configured to bond dies onto the same package substrate strip 22. In these embodiments, the bond heads 52 on the left guide ring 50 may be responsible for bonding dies 26 on the left half of the respective package substrate strip 22, while the bond heads 52 on the right guide ring 50 may be responsible for bonding dies 26 on the right half of the respective package substrate strip 22. The actions of bond heads 52 and the movement of package substrate strip 22 may be coordinated by a control unit (not shown).

In the embodiments, by using guide rings rather than straight guides to guide the movement of bond heads, the bond heads may loop in a single direction, rather than move back and forth. The multiple bonds heads thus do not need to wait for each other. Furthermore, with the multiple bond heads, the moving speed of each of the bond heads may be low, and hence the accuracy of the pack-and-pick process is high. In the meanwhile, the throughput of the place-and-pick is not sacrificed due to the efficient use of the multiple bond heads.

In accordance with embodiments, an apparatus includes a guide ring, and a bond head installed on the guide ring. The bond head is configured to move in loops along the guide ring. The bond head is configured to pick up dies and place the dies during the loops.

In accordance with other embodiments, an apparatus includes a guide ring, and a plurality of bond heads installed on the guide ring. The plurality of bond heads is configured to move along the guide ring in loops. A flux tank is disposed adjacent the first guide ring. An alignment tool is disposed adjacent the guide ring.

In accordance with yet other embodiments, a method includes operating a bond head to move along a guide ring for a loop, picking up a die using the bond head during the loop, and placing the die over a package component during the loop.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus comprising:
a first guide apparatus, wherein the first guide apparatus is configured in a ring shape; and
a first bond head installed on the first guide apparatus, wherein the first bond head is configured to move in a loop on the first guide apparatus, and wherein the first bond head is configured to pick up dies and place the dies during movement along the loop.

2. The apparatus of claim 1 further comprising:
a load guide adjacent the first guide apparatus and configured to transport a package component;
a loader configured to load the package component onto the load guide, wherein the load guide is disposed adjacent the first guide apparatus; and
an unloader configured to unload the package component from the load guide, wherein the bond head is configured to place the dies on the package component.

3. The apparatus of claim 2 further comprising:
a second guide apparatus adjacent to the load guide, wherein the second guide apparatus is configured in a ring shape; and
a second bond head installed on the second guide apparatus, wherein the second bond head is configured to move in a loop on the second guide apparatus, and wherein the second bond head is configured to pick up additional dies and place the additional dies.

4. The apparatus of claim 3, wherein the first bond head and the second bond head are configured to place the dies onto a first package substrate strip and a second package substrate strip, respectively.

5. The apparatus of claim 3, wherein the first bond head and the second bond head are configured to place the dies onto a same package substrate strip.

6. The apparatus of claim 1 further comprising a second bond head installed on the first guide apparatus, wherein the second bond head is configured to move in a loop on the first guide apparatus in a same direction as the first bond head.

7. The apparatus of claim 1 further comprising:
a flipper configured to flip the dies, wherein the first bond head is configured to pick up the dies that are flipped, and dip the dies in a flux tank; and
an alignment tool adjacent the guide apparatus, wherein the alignment tool is configured to align the dies picked up by the bond head.

8. The apparatus of claim 1, wherein the first bond head is configured to move in a first direction on the first guide apparatus, and is configured not to make substantial movement in a second direction on the guide apparatus, wherein the second direction is opposite the first direction.

9. An apparatus comprising:
a first guide apparatus, wherein the first guide apparatus is configured as a closed loop;
a first plurality of bond heads installed on the first guide apparatus, wherein the first plurality of bond heads is configured to move on the first guide apparatus in loops;
a first flux tank adjacent the first guide apparatus; and
a first alignment tool adjacent the first guide apparatus.

10. The apparatus of claim 9 further comprising:
a load guide adjacent the first guide apparatus;
a loader configured to load a package substrate strip to the load guide; and
an unloader configured to unload the package substrate strip from the load guide.

11. The apparatus of claim 9, wherein a total count of the first plurality of bond heads is greater than three.

12. The apparatus of claim 9 further comprising a flipper adjacent the first guide apparatus, wherein the flipper is configured to flip dies.

13. The apparatus of claim 9, wherein the first plurality of bond heads is configured to pick up and place dies, and wherein the alignment tool is configured to align the dies.

14. The apparatus of claim 9 further comprising:
a load guide;
a second guide apparatus wherein the second guide apparatus is configured as a closed loop, and wherein the first and the second guide apparatuses are adjacent the load guide;
a second plurality of bond heads installed on the second guide apparatus, wherein the second plurality of bond heads is configured to move along the second guide apparatus;
a second flux tank adjacent the second guide apparatus; and
a second alignment tool adjacent the second guide apparatus, wherein the second alignment tool is configured to align dies.

15. An apparatus comprising:
a first and a second guide apparatus, wherein the first and second guide apparatuses are configured in a ring shape; and
a first and a second bond head configured to rotate along the first and the second guide apparatuses respectively, wherein the first and the second bond heads are each configured to pick up and place dies.

16. The apparatus of claim 15, wherein the first and the second bond heads are configured to place dies on a first and a second package substrate respectively.

17. The apparatus of claim 15, wherein the first and the second bond heads are configured to place dies on a same package substrate.

18. The apparatus of claim 15, further comprising a third guide apparatus and a third bond head configured to rotate along the third guide apparatus, wherein the third bond head is configured to pick up and place dies, and wherein the third guide apparatus is configured in a ring shape.

19. The apparatus of claim 18, further comprising a fourth guide apparatus and a fourth bond head configured to rotate along the fourth guide apparatus, wherein the fourth guide apparatus is configured to pick up and place dies, and wherein the fourth guide apparatus is configured in a ring shape.

20. The apparatus of claim 15, wherein the first and the second bond heads are configured to rotate unidirectionally.

\* \* \* \* \*